United States Patent
Cheeranthodi

(10) Patent No.: US 8,415,985 B2
(45) Date of Patent: Apr. 9, 2013

(54) CIRCUITS AND METHODS FOR SAMPLING AND HOLDING DIFFERENTIAL INPUT SIGNALS

(75) Inventor: Rajesh Cheeranthodi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/180,399

(22) Filed: Jul. 11, 2011

(65) Prior Publication Data

US 2013/0015991 A1  Jan. 17, 2013

(51) Int. Cl.
*H03K 5/00* (2006.01)

(52) U.S. Cl. ............................. 327/95; 327/94; 327/96

(58) Field of Classification Search .............. 327/91, 327/94, 95, 96, 65, 67, 382, 390, 589
See application file for complete search history.

(56) References Cited

U.S. PATENT DOCUMENTS

| | | | | |
|---|---|---|---|---|
| 5,914,638 A * | 6/1999 | He | | 330/258 |
| 6,169,427 B1 * | 1/2001 | Brandt | | 327/94 |
| 6,642,751 B1 * | 11/2003 | Quinn | | 327/94 |
| 7,088,147 B2 * | 8/2006 | Prasad et al. | | 327/91 |
| 7,279,940 B1 * | 10/2007 | Min | | 327/95 |
| 2003/0151430 A1 * | 8/2003 | Hakkarainen et al. | | 327/94 |
| 2005/0285151 A1 * | 12/2005 | Kawasaki | | 257/213 |
| 2006/0022909 A1 * | 2/2006 | Kwak et al. | | 345/76 |
| 2006/0055436 A1 * | 3/2006 | Gaboriau et al. | | 327/94 |
| 2010/0219864 A1 * | 9/2010 | Farhat et al. | | 327/96 |

* cited by examiner

*Primary Examiner* — Lincoln Donovan
*Assistant Examiner* — Jung H Kim
(74) *Attorney, Agent, or Firm* — John R. Pessetto; W. James Brady; Frederick J. Telecky, Jr.

(57) ABSTRACT

Circuits and methods for sampling differential input signals having wide input swings including voltages below ground potential, and capable of operating on a single positive supply voltage are disclosed. In an embodiment, the circuit includes a first input switch circuit and a second input switch circuit, a sample and hold circuitry and an operational amplifier. Each of the first and second input switch circuits includes serially connected PMOS switch and NMOS switch for receiving a differential input signal. The sample and hold circuitry includes a first sampling capacitor, a second sampling capacitor and a plurality of switches. The switches are configured to provide the differential input signal to the sampling capacitors for the sampling in a sample phase, and are configured to provide the sampled differential input signal at an output of the operational amplifier in a hold phase.

11 Claims, 8 Drawing Sheets

CIRCUITS AND METHODS FOR SAMPLING AND HOLDING DIFFERENTIAL INPUT SIGNALS

TECHNICAL FIELD

The present disclosure generally relates to sample and hold circuits.

BACKGROUND

Presently, a great deal of emphasis is given in designing electronic circuits having lower area and power requirements. For such lower area and power requirements, employing single power supply voltages (e.g., either a single positive or single negative supply voltage) in the electronic circuits may also be considered in certain cases. In these electronic circuits, sometimes, real world signals may be in conflict with supply range provided by the single power supply. For example, a sample and hold circuit operating on a single positive voltage supply may be required to sample input voltages less than a ground voltage (Substrate potential).

In such type of sample and hold circuits, gate bootstrapped MOS switches (either PMOS or NMOS) are used. However, such sampling schemes have a number of operating constraints especially when they handle voltages below ground potential. For example, reliability should be maintained between the supply voltage and range of input voltages that is to be sampled. Further, linearity of such switches may be maintained by minimizing ON state switch resistance (by maximizing the gate overdrive of the MOS switches) and by ensuring that there should not be leakage current between terminals of the MOS switches during sample and hold phases.

SUMMARY

Circuits and methods for sampling differential input signals having wide input swings including voltages below ground potential and capable of operating on a single positive supply voltage are disclosed. In one embodiment, the circuit includes a first input switch circuit and a second input switch circuit, a sample and hold circuitry and an operational amplifier. Each of the first and second input switch circuits includes serially connected PMOS switch and NMOS switch for receiving a differential input signal. The sample and hold circuitry includes a first sampling capacitor, a second sampling capacitor and a plurality of switches. The switches are configured to provide the differential input signal to the sampling capacitors for the sampling in a sample phase, and are configured to provide the sampled differential input signal at an output of the operational amplifier.

Certain embodiments also provide NMOS switch for use in the circuits having bulk voltage control circuit and N-well voltage generation circuit for the NMOS switches. The bulk voltage control circuit is configured to maintain the bulk voltage of the NMOS switch lower than other terminals of the NMOS switch. The N-well voltage generation circuit is configured to maintain voltage of N-well of the NMOS switch greater than ground voltage and the bulk voltage of the NMOS switch.

DETAILED DESCRIPTION

Figure 1:
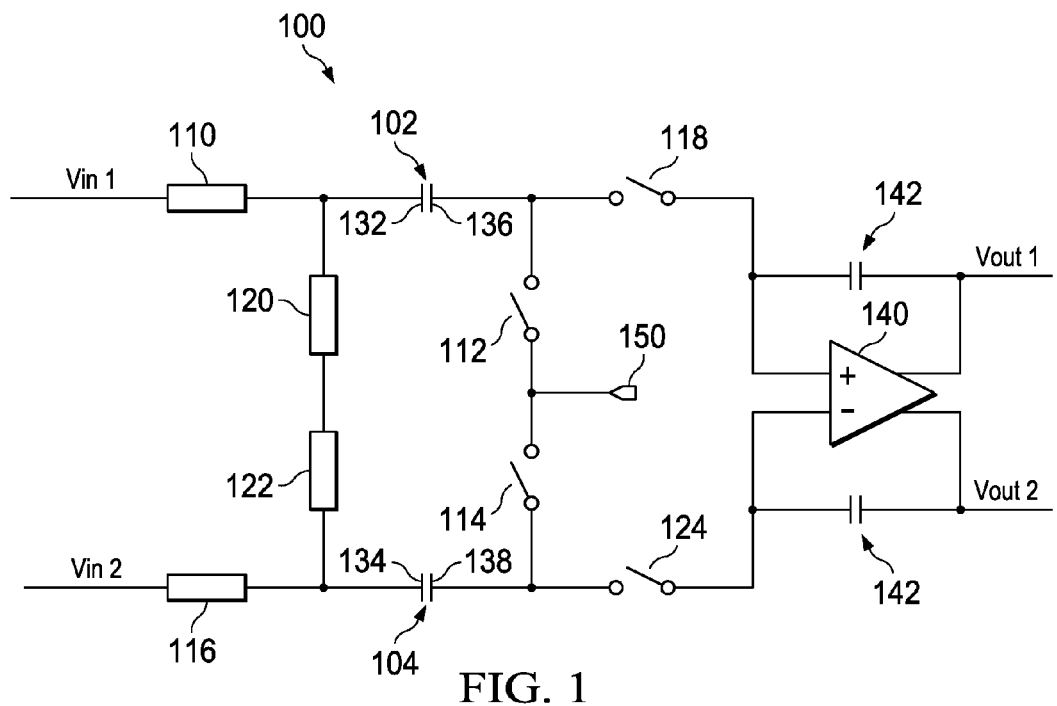
FIG. 1 illustrates a sample and hold circuit according to an exemplary scenario.

In an exemplary scenario, a sample and hold circuit 100 operating on a single power supply and capable of sampling negative voltages is shown in FIG. 1. The exemplary sample and hold circuit 100 receives the differential input (see, Vin1 and Vin2) for sampling. The sample and hold circuit 100 includes sampling capacitors 102 and 104, a plurality of switches 110-124, and an output amplifier 140. The sampling capacitors 102 and 104 selectively receive differential inputs (e.g., Vin1 and Vin2, respectively). In a sample phase, sampling switches 110, 112, 114 and 116 are configured to be in an ON condition, and voltages of the differential inputs (Vin1 and Vin2) is be sampled at the sampling capacitors 102 and 104. For instance, during the sample phase, the sampling switches 110, 112, 114 and 116 turn ON and the voltages at the bottom plates 132 and 134 of the sampling capacitors 102 and 104, become Vin1 and Vin2, respectively. In the sample phase, top plates 136 and 138 of the capacitors 102 and 104 achieve a reference voltage (Vmid) from a reference voltage source 150.

In a hold phase, switches 118, 120, 122 and 124 are configured to be turn ON and the voltages at the bottom plates 132 and 134 of the sampling capacitors 102 and 104, settle to an input common mode voltage (e.g., (Vin1+Vin2)/2). The charge sampled proportional to the differential input voltage (Vin1−Vin2) gets transferred to the feedback capacitors 142 of the output amplifier 140, which is utilized as outputs Vout1 and Vout2 of the sample and hold circuit 100.

Figure 2:
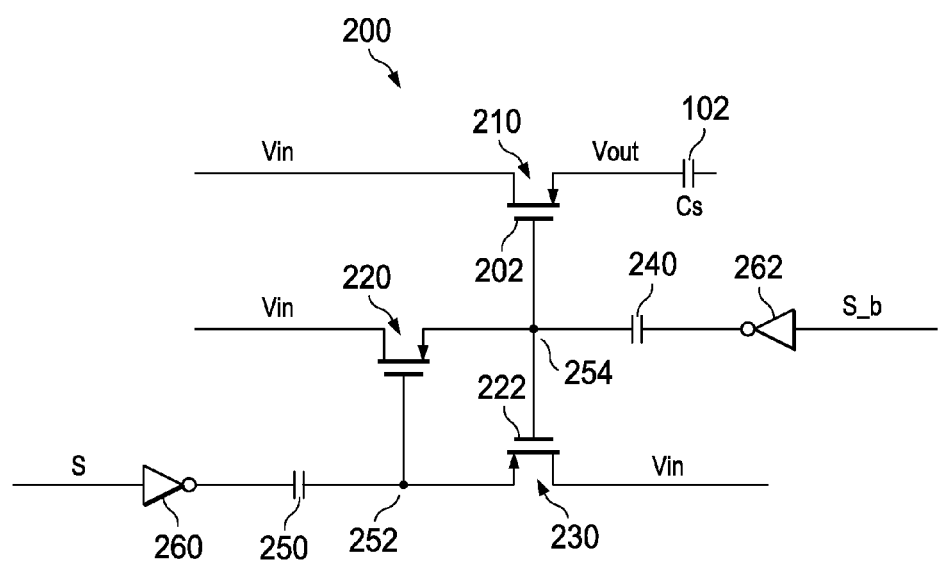
FIG. 2 illustrates an exemplary gate bootstrapped PMOS switch used in the sample and hold circuit of FIG. 1 according to an exemplary scenario.

The switches such as switches 110, 116, 120 and 122 may be gate bootstrapped switches. In different forms, the switches 110, 116, 120 and 122 may be either PMOS or isolated NMOS switches. Herein, the isolated NMOS structure refers to an NMOS structure configured in an isolated P-Well, so that the bulk voltage of the NMOS can be separately controlled. In the exemplary scenario shown in FIG. 1, the switches 110, 116, 120 and 122 is considered to be the PMOS switches. An exemplary PMOS switch that serves as an example of the PMOS switches 110, 116, 120 and 122 is shown in FIG. 2. The sample and hold circuit 100 samples voltages in the negative cycles of the input signals Vin1 and Vin2. In some forms, the voltages Vin1 and Vin2 may be less than the ground potential. However, in the negative cycles, a hold phase leakage current may be present in the PMOS switches utilized in the sample and hold circuit 100. The hold phase leakage current and associated distortion in accordance with an exemplary scenario is described herein in conjunction with FIGS. 3A-3B and 4A-4B.

Referring now to FIG. 2, a PMOS switch 200 is shown that may be an example of the switches 110, 116, 120 and 122 in the sample and hold circuit 100. As depicted in FIG. 2, the PMOS switch 200 includes three PMOS switches 210, 220 and 230, and bootstrapping capacitors 240 and 250. The switch 210 is a main PMOS switch, and the switches 220 and 230 in combination with the bootstrapping capacitors 240 and 250 serve as gate bootstrapping circuitry for the main PMOS switch 210, so that a particular gate voltage can be maintained at gate 202 of the PMOS main switch 210 during the sample and the hold phases.

For instance, when the clock or control signal is high (e.g., S='HIGH', and S_b='Low'), node 252 achieves a low voltage, as an inverter 260 outputs a low logic level and the bootstrapping capacitor 250 provides the low logic level at the node 252. The low logic level at the node 252 causes the switch 220 to achieve an ON condition. The ON condition of the switch 220 causes a sampling of Vin at node 254 by the switch 220.

Further, in the next half cycle of the clock or the control signal (e.g., S='LOW', and S_b='HIGH'), the switch 220 turns OFF, and the voltage at the node 254 drops from Vin to Vin−Vsupply due to the bootstrapping capacitor 240 (as the output of inverter 262 is at low logic level). As the node 254 is connected to the gates 202 and 222 of the switches 210 and 230, the voltages at the gates 202 and 222 attain the voltage of Vin−Vsupply. The low voltage (e.g., Vin−Vsupply) causes a sufficient gate to source voltage difference at the corresponding gates of the main switch 210 and the switch 230, thereby turning ON the switches 210 and 230. These cycles (of the sample and hold phases) continue with the clock or control signal, and the switch 210 attains the gate voltages as given below:

In On state: Vgate=Vin−Vsupply,
In OFF state: Vgate=Vin

Such bootstrapping scheme of the PMOS switch 200 may provide maximum possible gate overdrive (e.g., equal to Vsupply) in the ON condition, thus minimizing switch resistance of the switch 200. It should be noted that the N-well of the switches 210, 220 and 230 should be kept at an equal or higher voltage than that of the other terminals of the switches 210, 220 and 230 so that no p-n junctions are forward biased. Also, the N-well voltage can never go lower than the substrate potential (e.g., the ground voltage). However, the hold phase leakage current may be a significant factor in the PMOS switch 200 in the hold phase of the sample and hold circuit 100 that also causes harmonic distortion of a hold phase leakage current. The hold phase leakage current in the PMOS switch 200 and associated harmonic distortion are herein described in conjunction with FIGS. 3A-3B and 4A-4B.

Figure 3A:
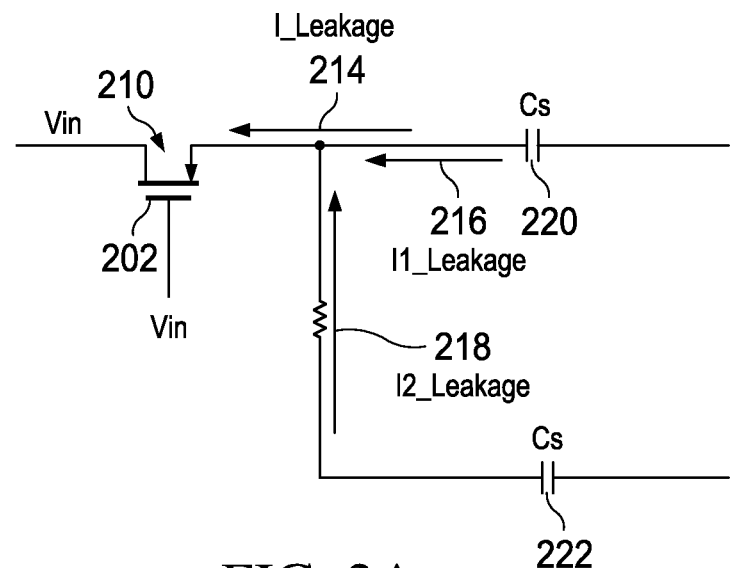
FIGS. 3A and 3B illustrate schematic representations of hold phase leakage in the PMOS switch of the FIG. 2 according to an exemplary scenario.
Figure 3B:
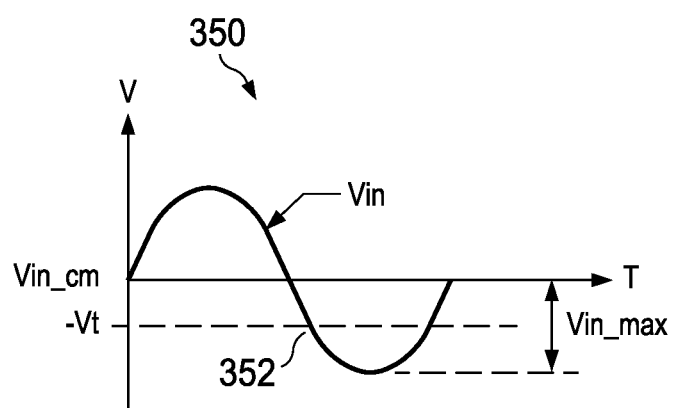

Referring to FIGS. 3A and 3B, a hold phase leakage current is described in a PMOS switch. As explained in conjunction with FIG. 2, during the hold phase, voltage at the gate of the PMOS switch 210 is equal to Vin. During the negative cycle of the input voltage (Vin) that is present at the gate of the PMOS switch (such as at the gate 202 of the PMOS switch 210), Vin may be lower than the common mode voltage (see, Vin_cm) present at a sampling capacitor such as the sampling capacitors 220 and/or 222 (see, Cs). As the value of Vin becomes lower than Vin_cm, a negative gate to source bias (Vgs) across the PMOS switch 210 may cause the switch 210 to achieve ON state. In one scenario, the Vgs bias across the PMOS switch 210 may be as high as maximum swing in the input voltage (Vin_max). In the negative half cycle of Vin, when the Vin goes below the common mode voltage (e.g., Vin_cm) by Vt, the negative gate to source voltage across the PMOS switch 210 causes the PMOS switch to start conducting, thereby generating the leakage current (see, I_leakage, 214 in FIG. 3A).

FIG. 3B represents a plot 350 of the voltage swing (V) of Vin with respect to the time (T). As shown in plot 350, when at some instant (e.g., at 352), Vin becomes lower than Vin_cm by Vt (the threshold voltage) of the PMOS switch 210, the PMOS switch 210 starts conducting, and a hold phase leakage current may be generated. It should be noted that the I_leakage 214 is generated from the sampling capacitors (Cs) 220 and 222, as the source 204 of the PMOS switch 210 is coupled to the sampling capacitors 220 and 222. The I_leakage 214 may be a sum of an I1_leakage 216 from the first sampling capacitor 220 and I2_leakage 218 from the second sampling capacitor 222. An example of the first sampling capacitor 220 may be sampling capacitor 102 and an example of the second sampling capacitor 222 may be the sampling capacitor 104. Additionally, it is noted that the hold phase leakage will also occur in an NMOS switch if the input voltage (Vin) is above the input common mode by Vt of the NMOS.

Figure 4A:
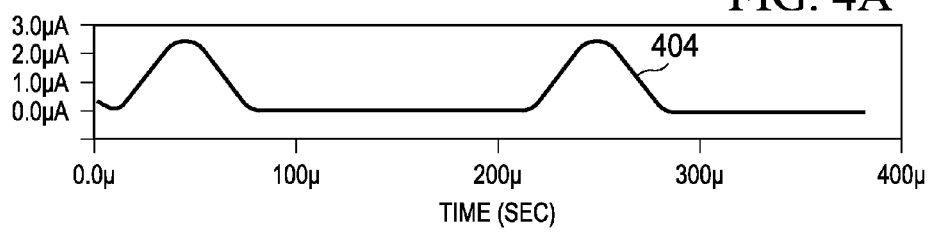
FIGS. 4A and 4B are schematic plots representing hold phase leakage current and harmonic distortion associated with the hold phase leakage current of the PMOS switch of FIG. 2 according to an exemplary scenario.
Figure 4A:
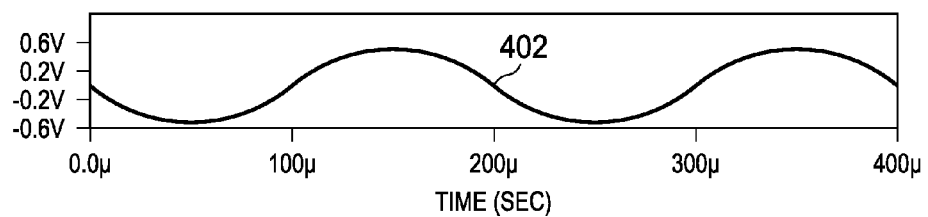
Figure 4B:
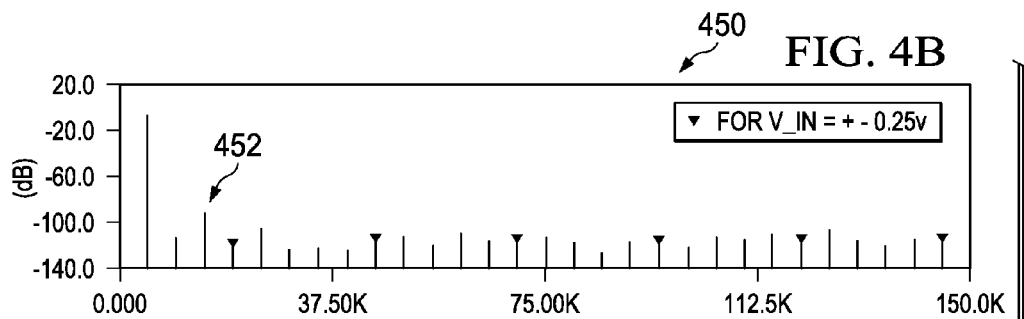
Figure 4B:
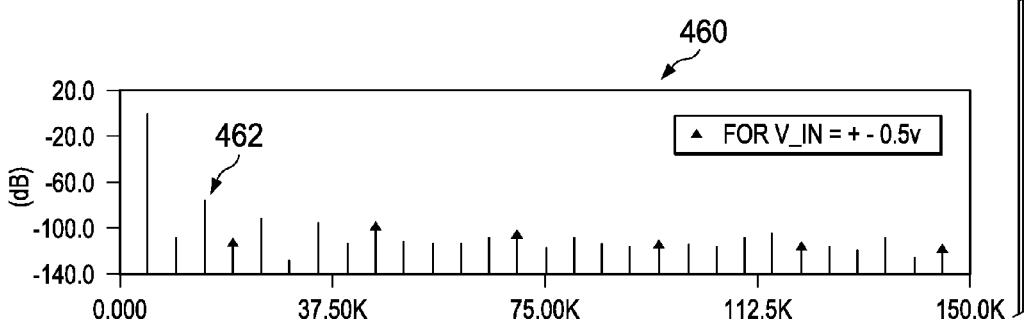

The leakage current and degradation in harmonic distortion performance of the sample and hold circuit 100 is shown in FIGS. 4A and 4B. Referring to FIG. 4A, a leakage current sampled during the hold phase in a PMOS switch such as the PMOS switch 210 is shown. In FIG. 4A, a plot 402 represents Vin (in Volt (V)) with respect to time (T) scale in micro (μ) seconds, and a plot 404 represents hold phase leakage current (in micro ampere (μA)) with respect to time (T) scale micro (μ) seconds, in the hold phase. It will be evident from the plots 402 and 404 that in the negative cycle of the Vin, the I_leakage starts generating, and the maximum I_leakage occurs at the maximum negative value of Vin. It may also be noted that for an NMOS switch, the maximum I_leakage may occur at a maximum positive value of Vin during the hold phase.

Referring now to FIG. 4B, a plot representing distortion performance due to the hold phase leakage current is illustrated. The hold phase leakage current may be generated if input voltage swing in the negative cycle is more than the threshold voltage VT of the PMOS switch. Such leakage current may also cause degradation in the harmonic distortion performance of the sample and hold circuit 100. Herein, plots 450 and 460 are shown representing harmonic performances of PMOS switch such as the PMOS switch 210. The plot 450 represents harmonic components of output signal (Vout), caused by the hold phase leakage current, at an input voltage (Vin) of 0.25 volt ("V"), and the plot 460 represents harmonic components of the output signal (Vout) at an input voltage (Vin) of 0.50 V. It is evident from the plots 450 and 460 that with the increase in the Vin, the harmonic components of the output signal also increase. For instance, a third harmonic (see, 452) of the output signal for the Vin having maximum amplitude of ±0.25 V is about −100 decibels ("db"), whereas a third harmonic (see, 462) of the output signal for the Vin having maximum amplitude of ±0.50 V is about −70 db. Accordingly, in the exemplary sample and hold circuit 100, generation of the hold phase leakage current may limit the maximum swing of the input voltage (Vin) that can be sampled by the circuit 100. More specifically, such hold phase leakage current limits the maximum input voltage swing to less than the threshold voltage (Vt) of the MOS switch, irrespective of the circuit 100 utilizing a PMOS switch or an NMOS switch.

Various embodiments of the present technology provide solutions for the hold phase leakage current in sample and hold circuits and the associated harmonic distortion that overcome the above and other limitations, in addition to providing currently unavailable benefits. Various embodiments of the present technology are herein disclosed in conjunction with FIGS. 5 to 9.

Figure 5:
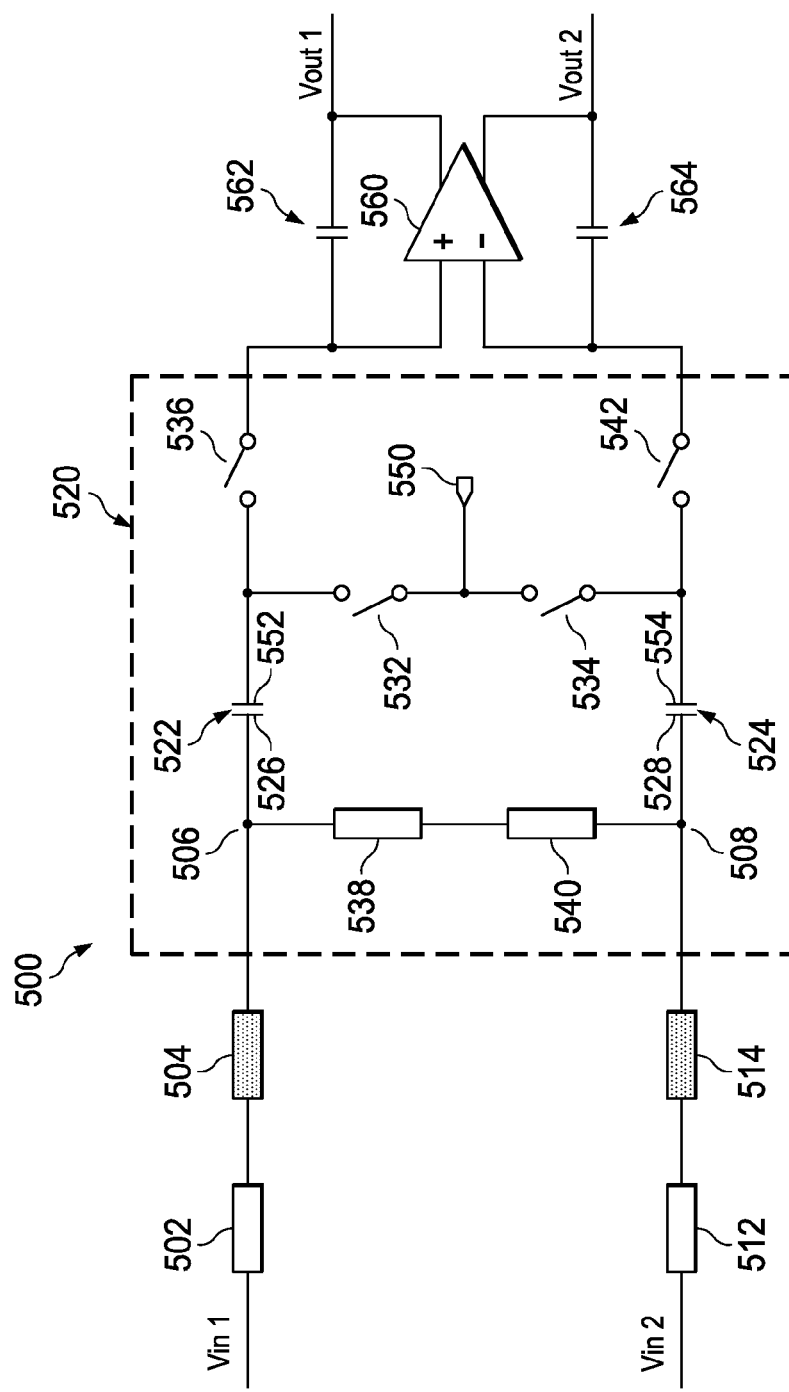
FIG. 5 illustrates a circuit for sampling and holding differential input signals having wide swings according to an embodiment.

FIG. 5 illustrates a sample and hold circuit 500 capable of sampling and holding input signals having maximum swing equal to supply voltage, according to an embodiment. In an embodiment, the circuit 500 may receive differential input signal having input swings equal to supply voltage (Vdd) in positive and negative cycles of the input signals of the differential input signals. The circuit 500 includes a first input switch circuit comprising a PMOS switch 502 and an NMOS switch 504, and a second input switch circuit comprising a PMOS switch 512 and an NMOS switch 514. As depicted, the PMOS switch 502 and the NMOS switch 504 are serially coupled or connected and are adapted to receive a first input signal of the differential input signal. Similarly, the PMOS switch 512 and the NMOS switch 514 are serially coupled or connected and are adapted to receive a second input signal of the differential input signal. For instance, the first signal (see, Vin1 in FIG. 5) is fed to the PMOS switch 502, and the second signal (see, Vin2 in FIG. 5) is fed to the PMOS switch 512. In some embodiments, the differential input signal may also be coupled with or connected to the NMOS switches 504 and 514 and their output may be fed to the PMOS switches 502 and 512.

The first input switch circuit and the second input switch circuit are coupled with or connected to a sample and hold circuitry 520. The sample and hold circuitry 520 includes a first sampling capacitor 522 and a second sampling capacitor 524, and a plurality of switches 532, 534, 536 538, 540 and 542. The first input switch circuit and the second input switch circuit selectively provide their outputs to the sampling capacitors 522 and 524. For instance, the first input switch circuit is selectively coupled with or connected to a first sampling capacitor 522 and the second input switch circuit is selectively coupled with or connected to the second sampling capacitor 524. In the embodiment shown in FIG. 5, an output 506 of the NMOS switch 504 of the first input switch circuit is shown as coupled with or connected to a bottom plate 526 of the first sampling capacitor 522. Similarly, an output 508 of the NMOS switch 514 of the second input switch circuit is shown as coupled with or connected to a bottom plate 528 of the second sampling capacitor 524. The top plates of the sampling capacitors (see, 552, and 554) are selectively coupled with or connected to a common reference voltage source 550, and an operational amplifier 560. For instance, a first input (shown as '+') of the operational amplifier 560 is coupled with or connected to the top plate 552 of the sampling capacitor 522, and a second input (shown as '−') of the operational amplifier 560 is coupled with or connected to the top plate 554 of the sampling capacitor 524.

In an embodiment, the switches 502, 504, 532, 534, 512, and 514 are configured such that these switches are in ON condition during the sample phase. Accordingly, during the sample phase, voltages of the input signals (Vin1 and Vin2) are sampled at bottom plates 526 and 528 of the sampling capacitors 522 and 524, respectively, through the first input switch circuit and the second input switch circuit. In the sample phase, top plates 552 and 554 of the sampling capacitors 522 and 524 sample the reference voltage (Vmid) from the reference voltage source 550.

In a hold phase, switches 536, 538, 540 and 542 turn ON (also the switches 502, 504, 532, 534, 512, and 514 turn OFF). Accordingly, voltages at the bottom plates 526 and 528 of the sampling capacitors 522 and 524, settle to a common mode voltage (e.g., (Vin1+Vin2)/2). The charge sampled proportional to the differential input voltage (Vin1−Vin2) gets transferred to the feedback capacitors 562 and 564 of the operational amplifier 560 that might be utilized as outputs Vout1 and Vout2 of the circuit 500.

Various embodiments of the present technology provide receiving the differential input signals via serial combination of the PMOS switch and the NMOS switch in an input switch circuit. As explained in conjunction with FIGS. 3A-3B, a hold phase leakage current occurs in the PMOS switch when the input voltage to the PMOS switch goes below the input common mode voltage (Vin_cm), whereas a hold phase leakage current may occur in the NMOS switch when the input voltage to the NMOS switch goes above the input common mode voltage (Vin_cm). As in various embodiments of the present technology, the PMOS switch and the NMOS switch are provided in series; accordingly, in either sides of swings of the input signals (e.g., more or less than a voltage level of the Vin_cm), hold phase leakage current may be avoided. Accordingly, the circuit 500 as shown in the embodiment of FIG. 5 is capable of sampling negative voltages (including voltages below ground potential) of the input signals, as during the negative cycle, the hold phase leakage current is avoided due to the serial connection of the NMOS and PMOS switches in the path of the input signals. Various embodiments also provide an NMOS switch, which may be utilized in the circuit 500, having improved bulk voltage control and N-well voltage, as explained in conjunction with FIGS. 6-8.

Figure 6:
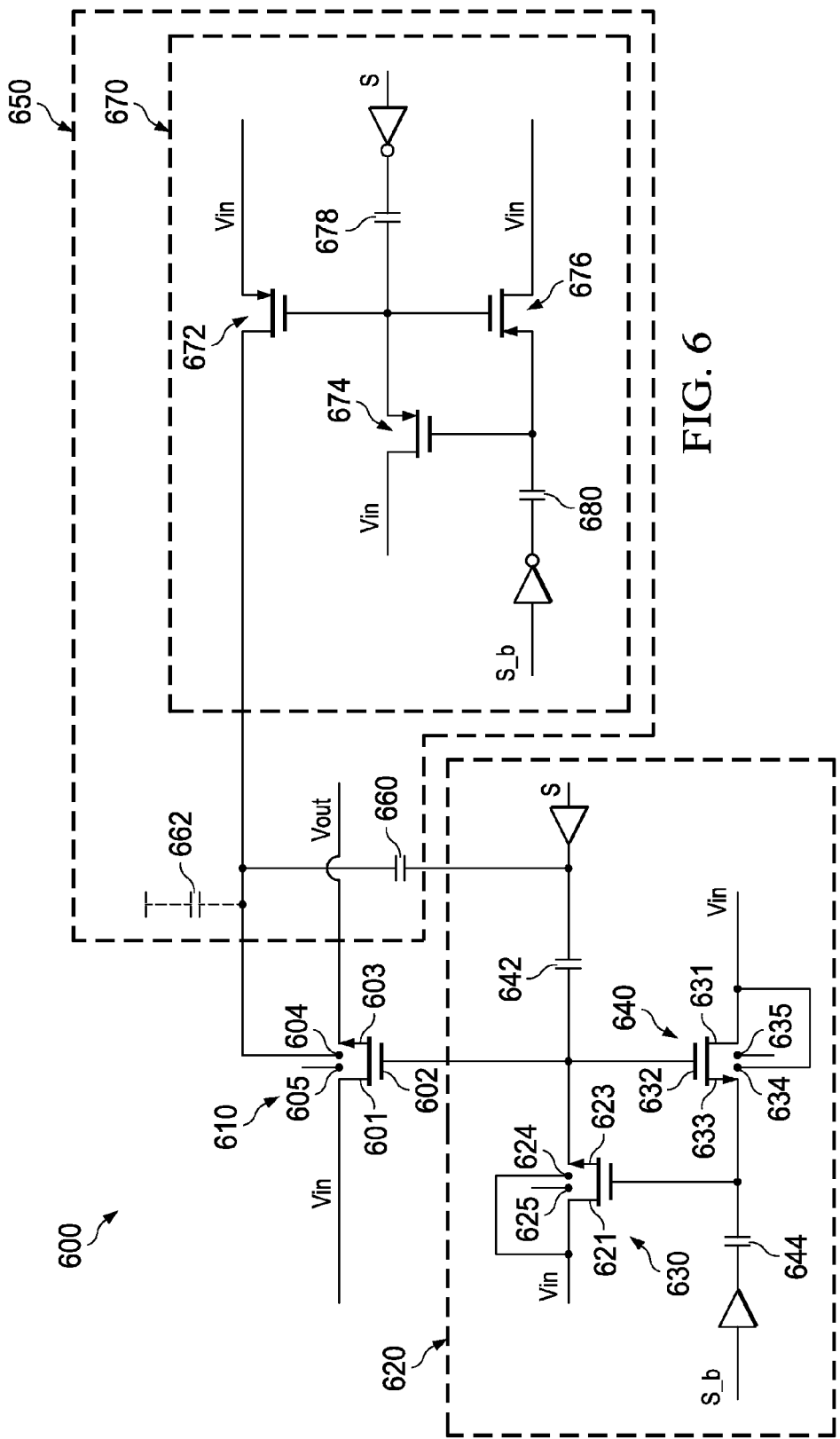
FIG. 6 illustrates an exemplary gate bootstrapped NMOS switch used in the circuit of FIG. 5 according to an embodiment.

Referring now to FIG. 6, a circuit diagram of an NMOS switch that can be used for the NMOS switches 504 and 514 in the circuit 500 is shown according to an embodiment. In an embodiment, the NMOS switch 600 is an isolated NMOS switch where the bulk voltage may be controlled through a capacitive coupling technique as explained herein.

The NMOS switch 600 includes a main NMOS switch 610, a bootstrapping circuitry 620 and a bulk voltage control circuit 650. In the embodiment shown in FIG. 6, the drain terminal of the main NMOS switch 610 is coupled with or connected to the output of a PMOS switch, such as the PMOS switches 502 or 512. For instance, the main NMOS switch 610 may receive the first input signal or the second input signal passed from the PMOS switches 502 or 512 at the drain 601 of the main NMOS switch 610. The output of the PMOS switch is represented as 'Vin', which is fed to the NMOS switch 600. In some embodiments, when the differential input signal is directly fed to the NMOS switch instead of the PMOS switch, Vin may be any of the Vin1 and Vin2. In these embodiments, output of the NMOS may be provided to the PMOS switches such as the PMOS switches 502 and 512, and the output of the PMOS switches may be provided to the sampling capacitors.

The bootstrapping circuitry 620 includes NMOS switches 630 and 640, and bootstrapping capacitors 642 and 644. As depicted in FIG. 6, the NMOS switches 630 and 640 are coupled with or connected to the gate 602 of the main NMOS switch 610. For instance, source 623 of the NMOS switch 630 and the gate 632 of the NMOS switch 640 are coupled with or connected to the gate 602 of the main NMOS switch 610. The NMOS switch 630 is operated by a clock or control signal (see, signal 'S') that is coupled with or connected to the source 623 of the NMOS switch 622 through the bootstrapping capacitor 642, and the NMOS switch 640 is operated by an inverted clock or control signal (see, signal 'S_b') that is coupled with or connected to the source 633 of the NMOS switch 640 through the bootstrapping capacitor 644. The NMOS switch 610 has similar gate bootstrapping schemes as described with reference to the PMOS switch 210 in conjunction with FIG. 2. During operation, in an ON state, voltage at the gate 602 of the main NMOS switch 610 may be equal to Vin+Vsupply; and in an OFF state, voltage at the gate 602 may be equal to Vin.

In the embodiment shown in FIG. 6, the drains (621 and 631) of the NMOS switches 630 and 640 may be coupled with or connected to the input signal Vin. In an embodiment, Vin may be the output of the PMOS switch. In an embodiment, voltage at bulks of the NMOS switches are maintained equal or less than the drain and source terminals of the NMOS switches, in order to avoid any leakage through the bulk. Accordingly, the bulk 624 of the NMOS switch 630 is coupled with or connected to the drain 621 of the NMOS switch 630, and the bulk 634 of the NMOS switch 640 may be coupled with or connected to the drain 631 of the NMOS switch 640.

Further, various embodiments of the present invention provide controlling the bulk voltage of the main NMOS switch 610. For instance, voltage at the bulk 604 of the NMOS switch 610 may be controlled by a bulk voltage control circuit 650. The bulk voltage control circuit 650 includes a bulk coupling capacitor 660 and a PMOS switch 670. The PMOS switch 670 may be similar to the PMOS switch 502 or 512 as explained with FIG. 5. For instance, the PMOS switch 670 may include a main PMOS switch 672, a bootstrapping PMOS switches 674 and 676, and bootstrapping capacitors 678 and 680. The functionality of the PMOS switch 670 is similar to the PMOS switch.

The PMOS main switch 672 provides the input signal Vin to the bulk 604 of main NMOS switch 610 in an ON condition. For instance, during the sample phase, the PMOS main switch 672 turns on and passes the Vin to the bulk 604 causing the voltage at the bulk 604 to be equal to Vin (e.g., Vbulk=Vin). During the hold Phase, the voltage of the source 603 of the main NMOS switch 610 may be equal to Vin_cm (e.g., the common mode voltage), as the source 603 is coupled with or connected to a sampling capacitor such as the sampling capacitors 522 or 524. In certain instances, in the positive cycle of Vin, the Vin_cm may be less than Vin by an amount maximum swing in the input voltage (Vin_max).

In order to avoid any leakage current through the bulk 604, the voltage of the bulk 604 (Vbulk) is maintained even lower than Vin in the hold phase. In order to keep the Vbulk even lower than Vin_cm in the hold phase (e.g., when 's' goes LOW), the bulk coupling capacitor 660 pulls down the Vbulk by a threshold voltage. In an embodiment, the threshold voltage may be equal to Vcc*Cbc/(Cbc+Cnwell). Accordingly, the value of Vbulk during the sample and hold phases are:

(1) In the sample phase: Vbulk=Vin, and
(2) In the hold phase: Vbulk=Vin−Vcc*Cbc/(Cbc+Cnwell), where Cbc denotes the capacitance of the bulk coupling capacitor 660, Cnwell denotes a peripheral capacitance 662 (internal capacitance) at the bulk 604, and Vcc is the power supply voltage. As the Vbulk is reduced by the threshold voltage in the hold phase, it ensures that the leakage current through the bulk of NMOS switch 610 is prevented for an input voltage swing in Vin as high as Vcc*Cbc/(Cbc+Cnwell)+Vt.

Various embodiments of the present technology provide regulation of voltage of the N-well of the NMOS switches utilized in the sample and hold circuit 500. For instance, it may be desirable that the voltage of the N-well (Vnwell) in the NMOS switches be greater than the ground potential and the voltage of the bulk (Vbulk). Accordingly, various embodiments provide N-well voltage generation schemes that are described in conjunction with FIG. 7.

Figure 7A:
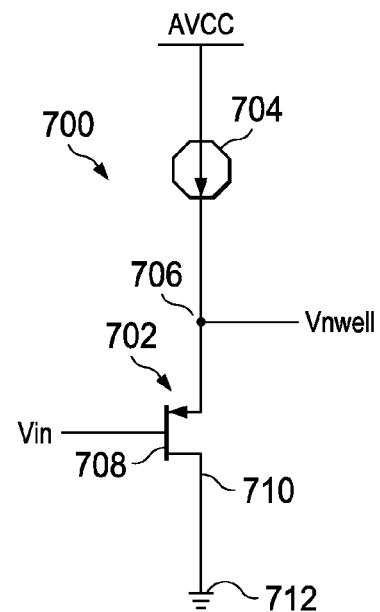
FIGS. 7A and 7B illustrate schematic representations of N-well voltage generation for the gate bootstrapped NMOS switch of FIG. 6 according to an embodiment.

FIG. 7A represents a schematic diagram of an N-well voltage generation circuit 700 and the corresponding plot 750 according to an embodiment. The N-Well voltage generation circuit 700 includes a transistor 702 and an energy (current source/mirror) source 704 coupled with the transistor 702. In the embodiment shown in FIG. 7A, the transistors 702 is a PMOS transistor, and the energy source may be a circuit such as a current source or current mirror circuit that is coupled with or connected to a source terminal 706 of the PMOS transistor 702. Gate terminal 708 of the transistor 702 is coupled with the Vin and drain terminal 710 of the transistor 702 is coupled with a ground terminal 712. Due to the presence of the energy source 704, source terminal 706 remain at a higher potential than the gate terminal 708 (at the potential of Vin). In this embodiment, voltage at the source 706 may be utilized as the voltage to be applied at the N-well of the NMOS switches. For instance, the N-wells 605, 625 and 635 of the NMOS switches 610, 630 and 640, respectively, may be coupled with or connected to the source terminal 706 of the transistor 702. Is should be noted that the circuit 700 as shown in FIG. 7 is for exemplary representation only, and in some alternate embodiments, the circuit 700 may also be embodied as alone or in combination of a number of other transistors such as the NMOS and CMOS transistors, and energy sources such as a voltage source and/or capacitors.

Figure 7B:
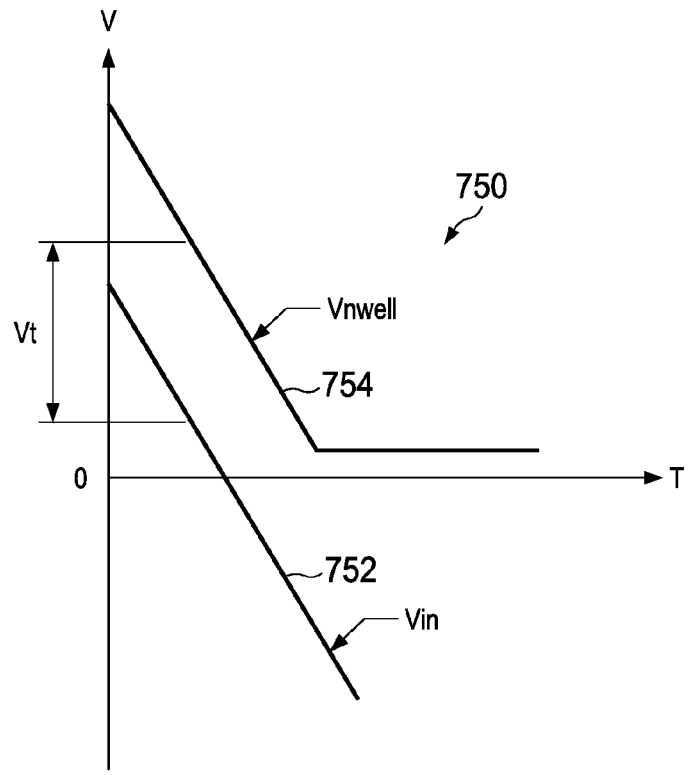

The value of the Vnwell with respect to Vin is shown in the plot 750 in FIG. 7B. As shown in the plot 750, as the Vin (see, 752) decreases towards a zero voltage, the Vnwell (see, 754) also decreases. In an embodiment, Vnwell is always greater than Vin by a margin of Vt of the PMOS transistor 702 as the Vin is positive. However, if Vin goes negative, Vnwell is above ground potential (zero voltage) due to the presence of the energy source 704. Accordingly, the N-well voltage generation circuit 700 ensures that the Vnwell is always above the Vin and the ground voltage.

Figure 8:
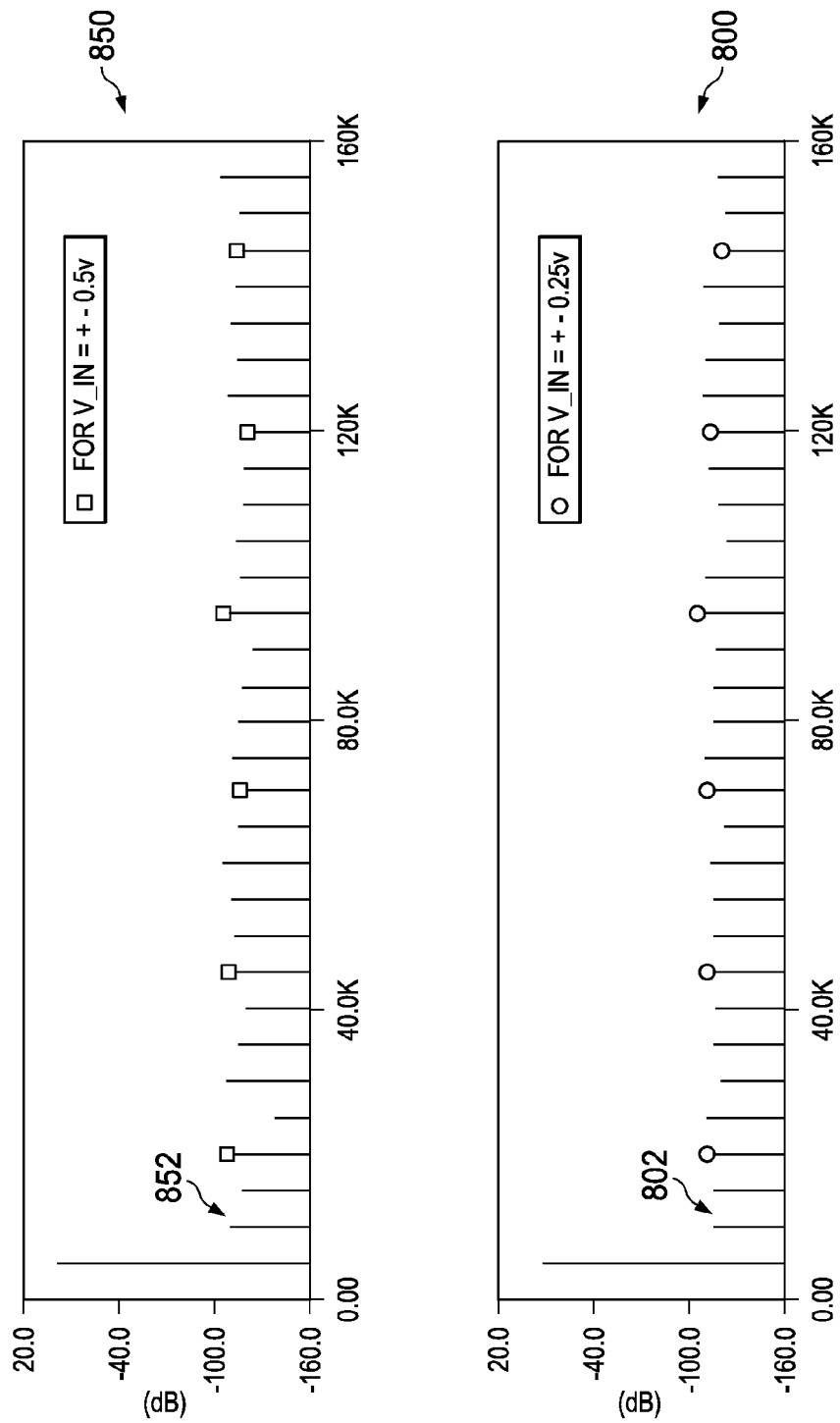
FIG. 8 is a schematic plot representing harmonic distortion in the circuit of FIG. 5 according to an embodiment.

Referring now to FIG. 8, plots 800 and 850 representing distortion performance due to the leakage current in the hold phase for a circuit, such as the circuit 500, are illustrated. Herein, plot 800 represents harmonic components of output signal (Vout) at an input voltage (Vin) having maximum swing 0.25 V, and the plot 850 represents harmonic components of the output signal (Vout) at an input voltage (Vin) having maximum swing of 0.50V. It is evident from the plots 800 and 850 that even with the increase in the maximum swing in Vin, the harmonic components of the output signal (Vout) remain almost similar. Further, as compared to the harmonic distortion plots 450-460 of the exemplary sample and hold circuit 100 (see, FIG. 4), the value of specific harmonics of the output signal (Vout) in the plots 800-850 are less. For instance, a third harmonic (see, 802) of the output signal (Vout) for the Vin having a maximum amplitude of ±0.25 V is about −120 db, which is lower than −100 db as experienced in the exemplary circuit 100. Similarly, a third harmonic (see, 852) of the output signal (Vout) for the Vin having a maximum amplitude of ±0.50 V is about −120 db, which is significantly lower than −70 db in the case of the exemplary circuit 100.

Figure 9:
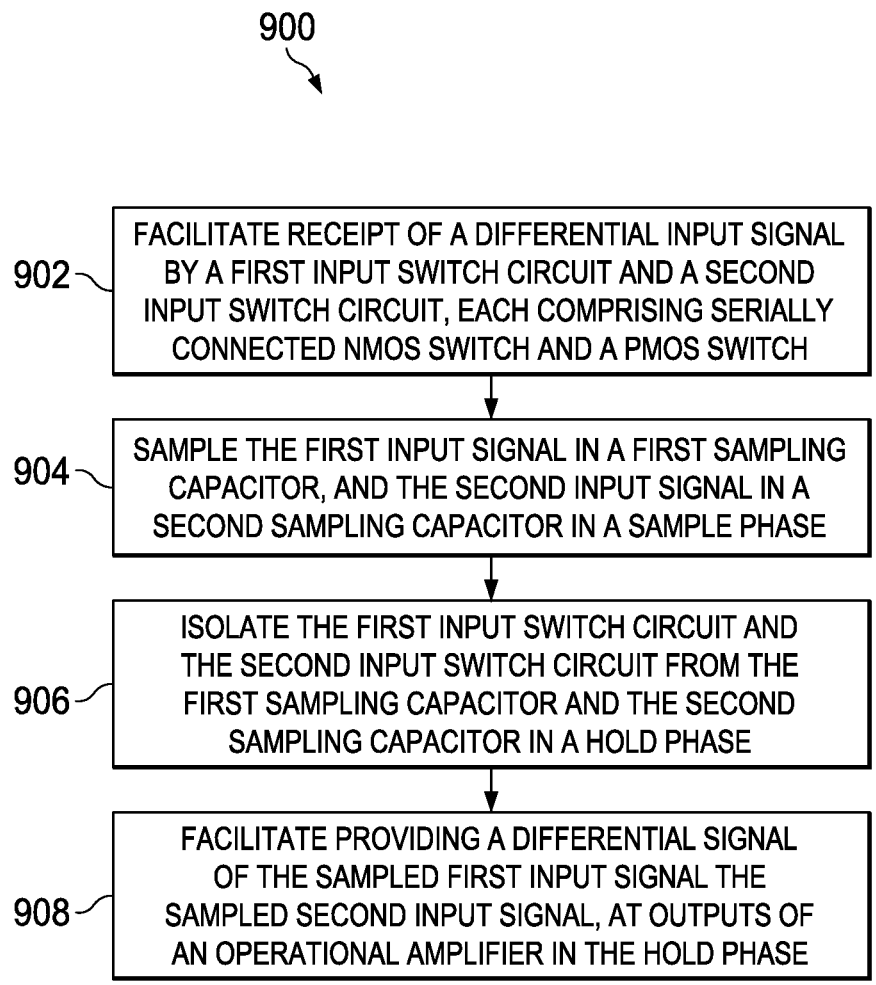
FIG. 9 is a flow diagram of a method for sampling and holding differential input signals according to an embodiment.

FIG. 9 is a flow diagram of a method 900 for sampling and holding differential input signals according to an embodiment. In certain embodiments, operations of method 900 may be performed by a circuit such as the circuit 500 (see, FIG. 5). At 902, the method 900 facilitates receiving a differential input signal by a first input switch circuit and a second input switch circuit. In an embodiment, each of the first input switch circuit and the second input switch circuit comprises a PMOS switch and an NMOS switch coupled or connected in series. A first input signal (see, Vin1 in FIG. 5) of a differential input signal is received by the first input switch circuit and a second input signal (see, Vin2 in FIG. 5) of the differential input signal is received by the second input switch circuit.

At 904, the method 900 includes sampling the first input signal in a first sampling capacitor, and sampling the second input signal in a second sampling capacitor in a sample phase. For example, as shown in FIG. 5, the Vin1 is sampled at the sampling capacitor 522, and the Vin2 is sampled at the sampling capacitor 524.

At 906, the method 900 includes isolating the first input switch circuit and the second input switch circuit from the first sampling capacitor and the second sampling capacitor in a hold phase. Further, at 908, the method 900 includes facilitating a differential signal of the sampled first input signal the sampled second input signal, at output Vout1 and Vout2 of an operational amplifier in the hold phase. For instance, as shown in FIG. 5, in the hold phase, bottom plates of the first sampling capacitor and the second sampling capacitor are coupled to achieve a common mode voltage of (Vin1+Vin2)/2, and a differential voltage (Vin1−Vin2) is transferred to the operational amplifier. As the PMOS switch and the NMOS switch are coupled or connected in series in each of the first input switch circuit and the second input switch circuit, hold phase leakage current may be avoided in either sides of swings of Vin (e.g., above and below the Vin_cm).

In some embodiments, facilitating the receipt of the differential input signal comprises providing an NMOS switch. The NMOS switch may be similar to the NMOS switch 600 as explained in conjunction with FIG. 6. In some embodiments, providing the NMOS comprises providing an output of the PMOS switch at the bulk of the main NMOS switch in the sample phase, and facilitating a pull down of the bulk voltage by a threshold voltage in the hold phase by a bulk coupling capacitor. The bulk coupling capacitor may be coupled with or connected to the bulk of a main NMOS switch of the NMOS switch.

In some embodiments, providing the NMOS switch also includes maintaining N-well voltage of the NMOS switch greater than the ground voltage and the bull voltage. In some embodiments, maintaining the N-well voltage comprises providing a MOS transistor having gate receiving an output of the PMOS switch, and providing an energy source coupled at a terminal of the MOS transistor, where the terminal may be one of a source terminal and a drain terminal of the MOS transistor. In an embodiment, the voltage of N-well (Vnwell) of NMOS switches may be the voltage at the terminal of the MOS transistor. Accordingly, the Vnwell may always be maintained greater than the input signal (Vin) and the ground voltage due to the presence of the energy source such as a current source.

Without in any way limiting the scope, interpretation, or application of the claims appearing below, advantages of one or more of the example embodiments disclosed herein is to provide wide swing for the signals that may be sampled by a circuit such as the sample and hold circuit 500. For instance, the input swing may be as high as equal to the supply voltage (VDD) in positive and negative cycles of the input signals, with respect to the input common mode voltage (Vin_cm). Further, the sample and hold circuit 500 is capable of sampling the input voltages below the ground potential, as the bootstrapped MOS switches are utilized. Further, during the negative voltage cycle of an input signal, the hold phase leakage current is avoided due to the serial connection of the NMOS and PMOS switches in the path of the Vin.

Further, various embodiments also advantageously provide a simpler N-well voltage generation scheme for the bootstrapped NMOS switch. Various embodiments also ensure that reliability between the input signal that may be sampled and the power supply may be up to Vdd+Vt for a MOS switch, where Vt is a threshold voltage of the MOS switch. Such solutions allow much wider input swings at the input signals, while maintaining a minimal ON resistance of the MOS switches (by making the gate to source voltage in ON condition equal to Vdd).

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions are apparent and well within the spirit and scope of the technology.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A sample and hold circuit capable of operating on a single positive supply voltage, the sample and hold circuit comprising:
   first and second input switch circuits configured to receive first and second input signals of a differential signal, respectively, each of the first and second input switch circuits comprising:
      an output, and
      a PMOS switch coupled in series with an NMOS switch;
   a sample and hold circuitry comprising:
      first and second sampling capacitors, each having an output terminal, and
      a plurality of switches configured to:
         electrically couple the outputs of the first and second input switch circuits with the first and second sampling capacitors, respectively, to enable a sampling of the first and second input signals at the first and second sampling capacitors, respectively, in a sample phase, and
         isolate the first and second input signals from the first and second sampling capacitors, respectively, in a hold phase; and
      an operational amplifier having first and second inputs and first and second outputs, the first and second inputs coupled with the output terminals of the first and second sampling capacitors, respectively, and the plurality of switches being further configured to pass a differential of the first and second input signals in the hold phase at the first and second outputs of the operational amplifier;

wherein the NMOS switch comprises:

a main NMOS switch;

a bootstrapping circuit comprising one or more NMOS switches and bootstrapping capacitors connected to a gate of the main NMOS switch; and a bulk voltage control circuit connected to a bulk of the main NMOS switch, the bulk voltage control circuit configured to maintain a bulk voltage of the main NMOS switch equal to a voltage at one of a source terminal and a drain terminal of the main NMOS switch in the sample phase, and to maintain a pull down of the bulk voltage by a threshold voltage in the hold phase.

2. The sample and hold circuit of claim 1, wherein the bulk voltage control circuit comprises:

a gate bootstrapped PMOS switch capable of receiving output of the PMOS switch as an input signal and passing the input signal to the bulk of the main NMOS switch in the sample phase; and a bulk coupling capacitor connected to the bulk of the main NMOS switch for pulling down the bulk voltage by the threshold voltage in the hold phase.

3. The sample and hold circuit of claim 2, wherein the threshold voltage is proportional to $Vcc*Cbc/(Cbc+Cnwell)$, where $Vcc$ is a supply voltage, $Cbc$ is the bulk coupling capacitor and $Cnwell$ is a peripheral capacitance associated with the bulk of the main NMOS switch.

4. The sample and hold circuit of claim 1, wherein bulks of the one or more NMOS switches of the bootstrapping circuit are connected to drain terminals of the one or more NMOS switches, wherein the drain terminals are connected to output of the PMOS switch.

5. The sample and hold circuit of claim 1, wherein the sample and hold circuit further comprises an N-well voltage generation circuit for at least one NMOS switch for maintaining N-well voltage of the NMOS switch greater than the ground voltage and the bulk voltage.

6. The sample and hold circuit of claim 5, wherein the N-well voltage generation circuit comprising:

a MOS transistor, wherein a gate of the MOS transistor is configured to receive an output of the PMOS switch as input; and an energy source coupled at a terminal of the MOS transistor, the terminal being one of a source terminal and a drain terminal of the MOS transistor, the N-well voltage being the voltage at the terminal of the MOS transistor, thereby maintaining the N-well voltage greater than the input signal and the ground voltage.

7. The sample and hold circuit of claim 6, wherein the energy source is one of a current source and a current mirror circuit.

8. A method for sampling and holding a differential input signal, the method comprising:

facilitating a receipt of a differential input signal by first and second input switch circuits each including a PMOS switch coupled in series with an NMOS switch, the differential input signal including first and second input signals, and the first and second input signals being received by the first and second input switch circuits, respectively;

sampling the first and second input signals with first and second sampling capacitors, respectively, in a sample phase;

isolating the first and second input switch circuits from the first and second sampling capacitors, respectively, in a hold phase; and facilitating outputs of a differential signal of the sampled first and second input signals from an operational amplifier in the hold phase;

wherein facilitating receiving the differential input signal comprises providing an NMOS switch, the NMOS switch comprising:

a main NMOS switch;

a bootstrapping circuit comprising one or more NMOS switches and bootstrapping capacitors connected to a gate of the main NMOS switch; and a bulk voltage control circuit connected to a bulk of the main NMOS switch, the bulk voltage control circuit configured to maintain a bulk voltage of the main NMOS switch equal to a voltage at one of a source terminal and a drain terminal of the main NMOS switch in the sample phase, and to maintain a pull down of the bulk voltage by a threshold voltage in the hold phase.

9. The method of claim 8, wherein providing the NMOS switch comprises:

providing an output of the PMOS switch at the bulk of the main NMOS switch in the sample phase; and facilitating a pull down of the bulk voltage by the threshold voltage in the hold phase by a bulk coupling capacitor, wherein the bulk coupling capacitor is connected to the bulk of the main NMOS switch.

10. The method of claim 8, further comprising maintaining N-well voltage of the NMOS switch greater than the ground voltage and the bulk voltage.

11. The method of claim 10, wherein maintaining the N-well voltage comprises:

providing a MOS transistor having gate receiving an output of the PMOS switch; and providing an energy source coupled at a terminal of the MOS transistor, the terminal being one of a source terminal and a drain terminal of the MOS transistor, the N-well voltage being the voltage at the terminal of the MOS transistor, thereby maintaining the N-well voltage greater than the input signal and the ground voltage.

\* \* \* \* \*